United States Patent [19]

Kobayashi et al.

[11] Patent Number: 5,104,772

[45] Date of Patent: Apr. 14, 1992

[54] METHOD OF FORMING FINE RESIST PATTERN IN ELECTRON BEAM OR X-RAY LITHOGRAPHY

[75] Inventors: Koichi Kobayashi, Yokohama; Yasushi Takahashi, Kawasaki, both of Japan

[73] Assignee: Fujitsu Limited, Kawasaki, Japan

[21] Appl. No.: 666,567

[22] Filed: Mar. 8, 1991

Related U.S. Application Data

[63] Continuation of Ser. No. 453,217, Dec. 21, 1989, abandoned, which is a continuation of Ser. No. 147,877, Jan. 25, 1988, abandoned.

[30] Foreign Application Priority Data

Jan. 27, 1987 [JP] Japan .................... 62-016727

[51] Int. Cl.$^5$ .............................................. G03C 5/00
[52] U.S. Cl. ...................................... 430/296; 430/270; 430/322; 430/325; 430/328; 430/394; 430/494; 430/942; 430/966; 430/967
[58] Field of Search ............... 430/296, 322, 327, 328, 430/394, 494, 942, 966, 967, 270

[56] References Cited

U.S. PATENT DOCUMENTS

| | | | |
|---|---|---|---|
| 4,056,393 | 11/1977 | Schlesinger et al. | 430/296 |
| 4,298,803 | 11/1981 | Matsuura et al. | |
| 4,403,151 | 9/1983 | Mochiji et al. | 430/942 |
| 4,508,813 | 4/1985 | Nakagawa | 430/290 |
| 4,552,831 | 11/1985 | Liu | 430/290 |
| 4,659,650 | 4/1987 | Moritz et al. | 430/328 |
| 4,715,929 | 12/1987 | Ogawa | 430/270 |
| 4,806,456 | 2/1989 | Katoh | 430/942 |

FOREIGN PATENT DOCUMENTS

| | | |
|---|---|---|
| 0209152 | 1/1987 | European Pat. Off. |
| 2927242 | 1/1981 | Fed. Rep. of Germany |
| 0102018 | 6/1982 | Japan ............ 430/328 |
| 0200534 | 11/1983 | Japan ............ 430/328 |
| 0002326 | 1/1986 | Japan ............ 430/296 |
| 0141133 | 6/1986 | Japan ............ 430/296 |
| 3073518 | 4/1988 | Japan ............ 430/296 |

OTHER PUBLICATIONS

"Hybrid E-Beam/Deep-UV Exposure Using Portable Conformable Masking (PCM) Technique" by Lin et al., J. Vac. Sci. Technol., 16(6), Nov./Dec. 1979, pp. 1669-1671.

"U. V. Hardening of Photo- and Electron Beam Resist Patterns" by Hiraoka et al., J. Vac. Sci. Technol., 19(4), Nov./Dec. 1981, pp. 1132-1135.

IBM Technical Disclosure Bulletin, vol. 24, No. 11A, Apr. 1982, p. 5549, New York, U.S.; G. E. Henderson et al.: "Profile Improvement in E-Beam-Exposed Resist Patterns".

*Primary Examiner*—Ellis P. Robinson
*Assistant Examiner*—Donald J. Loney
*Attorney, Agent, or Firm*—Staas & Halsey

[57] ABSTRACT

To achieve higher resolution integration in semiconductor device fabrication using electron beam (EB) or X-ray lithography or a method of lithography is disclosed in which: (1) an EB or X-ray resist material is mixed with an absorbing material for ultraviolet (UV)-rays; (2) the resist layer is selectively exposed to the EB or X-ray with the total irradiation density less than applied in a conventional EB or X-ray exposure; and (3) the entire surface of the resist layer is further exposed to the UV-ray for a total irradiation period less than a minimum level required to induce a reaction in said resist layer. Resist materials such as chloromethylated polystyrene (CMS), polydiarylorthophtalate (PDOP), and polymethylmethacrylate (PMMA), each mixed with p-azido acetophenone as the UV-ray absorbing material improve contrast and resolution of the resist layer. Other UV-ray absorbing materials such as p-azido benzoic acid and 3-sulfonylazido benzoic acid achieve the same result.

18 Claims, 2 Drawing Sheets

METHOD OF FORMING FINE RESIST PATTERN IN ELECTRON BEAM OR X-RAY LITHOGRAPHY

This application is a continuation of application Ser. No. 453,217, filed Dec. 21, 1989, now abandoned, which is a continuation of copending application Ser. No. 147,877, filed on Jan. 25, 1988, now abandoned.

BACKGROUND OF THE INVENTION

1. Field of the Invention

This invention relates to a method of forming a fine resist pattern on a semiconductor substrate. More specifically, this invention relates to a lithography technique utilizing an electron beam or an X-ray beam in an exposure process for forming a resist layer on the substrate.

2. Description of the Prior Art

Prior art lithography techniques utilize ultraviolet light to expose a resist layer formed on a semiconductor substrate. However, the ultraviolet light technique has resolution limitations and is not suitable for a resist pattern having dimensions of less than one micron. Because of a trend toward higher integration of semiconductor devices, the need to form a smaller resist pattern (less than one micron) has developed. The development of electron beam and X-ray lithography has, to some extent, allowed formation of patterns this small.

In electron beam lithography, an electron beam having an energy level of about 20 to 30 KeV (Kilo-electron-Volts) is applied to a resist layer (having a thickness of about 1 micron) formed on the semiconductor substrate. However, the energy level of the electron beam is of a level sufficient to penetrate the resist layer, and the electrons collide with and penetrate the substrate under the resist layer. The penetrating electrons induce forward and backward scattering of electrons. Therefore, the resist layer is subjected to extra exposure, particularly by the backwardly scattered electrons. Because the scattering pattern of the electrons is isotropic, portions of the resist layer adjacent to the pattern used in forming the resist layer are affected by the scattering electrons, even though the portions are not directly exposed. This partial exposure causes pattern precision and contrast deterioration and/or blurring of the pattern.

FIGS. 1(a) and 1(b) are cross-sections of a semiconductor device in which a negative type resist layer 1 is formed on semiconductor substrate 2 and is exposed to an electron beam having a width W. Hereinafter, this negative type resist electron beam lithography process is abbreviated as a negative EB resist (if a positive-type resist layer is used, it is called a positive EB resist). After resist layer 1 is developed, the pattern 1' is obtained. As shown in FIG. 1(b), pattern 1' is equal to the electron beam width W at the top surface of the patterned resist layer. However, the width of pattern 1' gradually broadens toward the substrate 2 due to the above-mentioned electron scattering. When a positive EB resist layer 1 is used, the formed resist pattern 1' is reversed, as shown in FIG. 2.

In X-ray lithography; X-rays collide with the substrate after penetrating the resist layer causing the emission of electrons (photons) from the substrate surface. As with electron beam lithography, the resist layer is exposed to the scattering photons, resulting in a decrease of contrast and blurring of the resist pattern. This phenomena occurs particularly when SOR (Synchrotron Orbitary Radiation) is used as the X-ray source, and especially when a very short wavelength (for example, less than one Angstrom) is utilized.

Several prior art methods have been developed to solve this problem. One method is to control the acceleration voltage of the electron beam. When the acceleration voltage for electron beam is increased, the electron penetrates more deeply into the substrate, and the backward scattering electrons from this deeper penetration of the substrate have a smaller energy level, lowering the effect on the resist layer. Therefore, the application of an electron beam of high voltage is preferable to reduce pattern blurring.

Another method is to apply a multilayer resist system, in which plural resist layers are laminated on the substrate. An upper resist layer is an electron beam sensitive layer and a lower resist layer, having a greater thickness than that of the upper layer, is a buffer layer for absorbing scattering electrons.

The above methods are commonly known techniques for both EB and X-ray lithography. Other methods also exist, however, further improvement of resolution to avoid blurring when using EB or X-ray lithography is, of course, desirable.

SUMMARY OF THE INVENTION

It is an object of the present invention to provide a method of avoiding resist pattern resolution deterioration due to backward scattering electrons or photons in EB or X-ray lithography.

Another object of the present invention is to provide a method of avoiding resist pattern resolution deterioration which can be applied by conventional apparatus used in EB or X-ray lithography and which consists of simple process steps.

These objects are achieved by a method in which: (1) the EB or X-ray resist material is mixed with ultraviolet-ray absorbing material; (2) the resist layer is selectively exposed to an EB or X-ray of an energy level below that used in the conventional EB or X-ray exposure, to obtain a chemical reaction in the resist layer; and (3) the entire surface of the resist layer is then exposed to ultraviolet rays of an energy level below the minimum level of irradiation necessary for the resist layer to exhibit a photo reaction.

The selectively exposed region of the resist layer receives a sufficient exposure to both ultraviolet rays (abbreviated as UV ray) and EB or X-rays, to produce a chemical reaction in the resist layer (such as a cross-linkage reaction). However, in the region not subjected to the selective exposure, a substantial amount of UV-rays are absorbed in the upper portion of the resist layer, especially near the surface thereof, and very little of the UV-rays reach the portion where the resist layer meets the semiconductor substrate. Therefore, the resist layer not exposed to EB or X-rays lacks enough energy to cause a chemical reaction, even though it is subjected to backward scattering electrons. As a result, contrast or resolution is greatly improved and the blurring of the resist pattern is avoided.

The above method of the present invention is not restricted to the above-mentioned order of UV-ray and EB/X-ray exposure. The UV-ray exposure can be applied before or after the EB/X-ray exposure, and the same result is achieved.

DESCRIPTION OF THE PREFERRED EMBODIMENTS

Figure 1A:
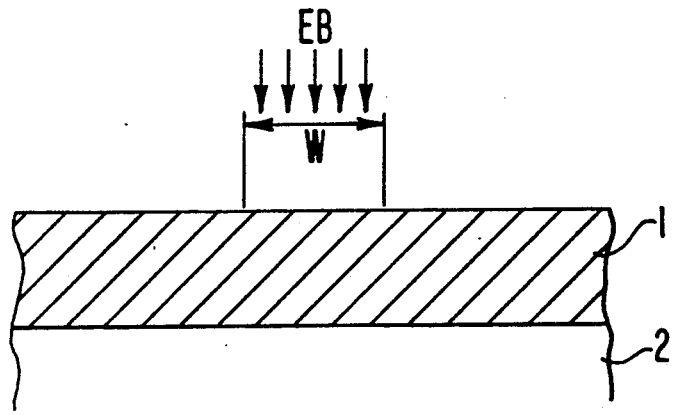
FIGS. 1(a) and 1(b) are cross-sections of a prior art semiconductor in which a negative type resist layer is formed on a substrate and is exposed to an electron beam having a width W, and is then developed.
Figure 1B:
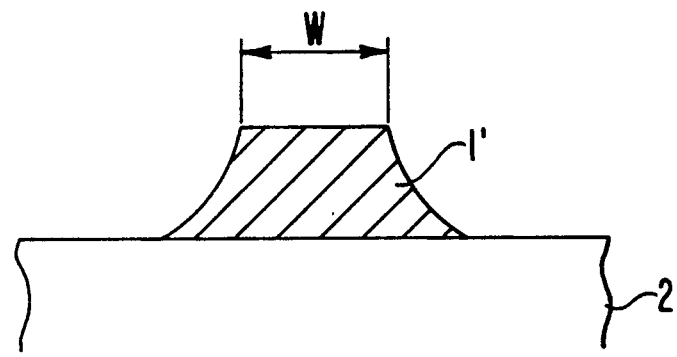
Figure 2:
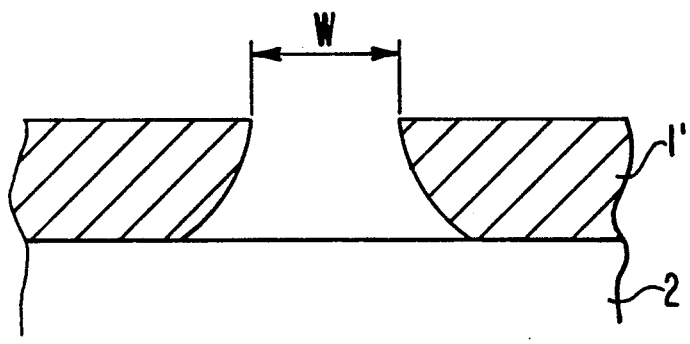
FIG. 2 is a cross-section of a prior art semiconductor in which a positive EB resist layer is formed, exposed and developed instead of the negative EB resist layer used in FIG. 1, resulting in formation of a pattern reversed from that shown in FIG. 1(b)
Figure 3:
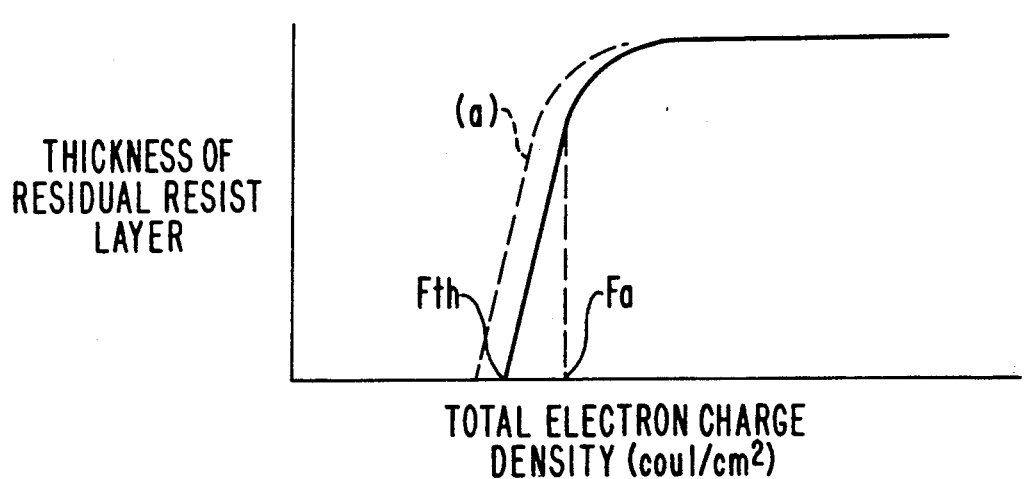
FIG. 3 shows a typical relationship between the thickness of a residual resist layer after development and the total electron charge density applied during the EB exposure using the resist material of the present invention.

FIG. 3 illustrates a relationship between the thickness of a residual resist layer and the total electron charge density applied during an EB exposure, when the resist layer, formed utilizing a negative EB resist material mixed with UV-ray absorbing material, is exposed to the EB and then developed. In FIG. 3, a solid curve illustrates generally the characteristic of the negative resist material of the present invention. As can be seen from FIG. 3, a total charge density greater than Fth is necessary to leave at least a thin resist layer after the exposure and development steps. An exposure at the Fth level is called a resist production level. In other words, if the total charge density is less than Fth, the chemical reaction does not occur in the resist material. Generally, a total charge density of Fa is used in EB lithography.

Figure 4:
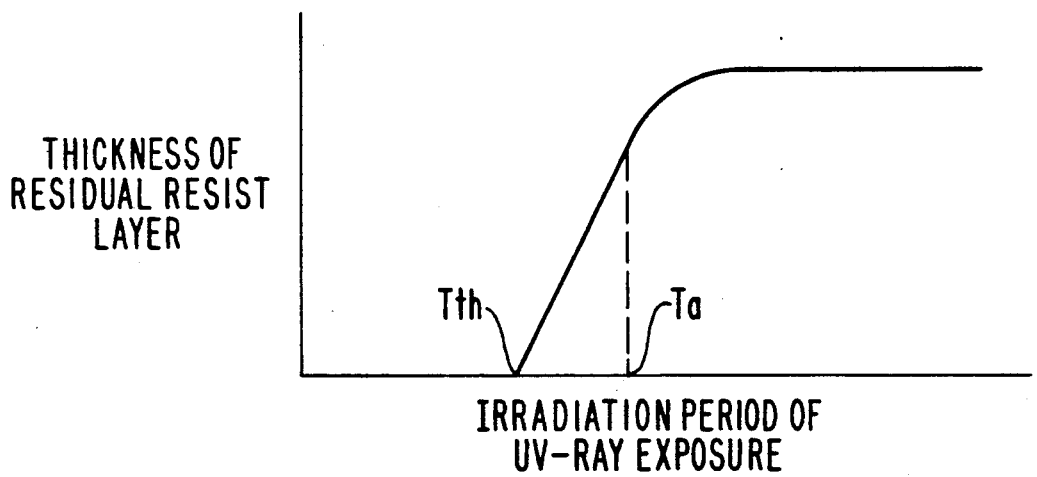
FIG. 4 shows the typical relationship between the thickness of a residual resist layer after development and the exposure period required by a conventional UV-ray source, using the same resist material as that of FIG. 3.

The resist material exhibits similar reaction characteristics when exposed to an UV-ray. FIG. 4 shows a typical curve of this reaction characteristic. In FIG. 4, the abscissa represents the irradiation period during exposure using a conventional UV-ray source. The curve shows a tendency similar to that shown in FIG. 3, however in FIG. 4, Tth denotes the minimum duration of irradiation required for the resist layer to at least partially remain after the development process (the resist production level). To obtain a conventional resist layer thickness, the duration period Ta is necessary for the exposure process when using only a UV-ray.

In the EB exposure process, the value of Fth is affected little by changing an acceleration voltage. When the acceleration voltage is decreased, the curve is shifted to the left as shown by dashed curve (a) in FIG. 3. According to the present invention, the total charge density of EB irradiation onto the exposure area, using the constant accelerating voltage of E KeV, is controlled in such a way that the quantity of backward scattering electrons scattered to nearby portions of resist layers not part of the exposure area is reduced to a level less than Fth. In this case the total charge density projected onto the exposed area is usually lower than Fa. The beam lacks sufficient charge density throughout the entire thickness of the resist layer to cause the chemical reaction necessary for the resist to remain after the development process.

In the present invention, this shortage of electrons is supplemented by the application of the UV-ray on the entire unmasked surface of resist layer. The irradiating duration of the supplementary UV-ray exposure is shorter than Tth (shown in FIG. 4). A resist layer, which is not subjected to the above previous EB exposure (or is not subsequently exposed to electron beams), does not exhibit any reaction in the lithography processes.

In an X-ray exposure, the X-ray resist has similar characteristics as described with regard to the EB resist, and therefore a similar curve as that shown in FIG. 3 is obtained, except that the abscissa represents the total X-ray irradiation density. The exposure processes are the same as explained above except that the EB exposure is replaced by the X-ray exposure.

In a first embodiment, chloromethylated polystyrene (abbreviated CMS) is used as the negative EB resist, and p-azido acetophenone is used as the UV-ray absorbing material. A xylene solution containing 20-30% by weight of CMS and 10% by weight of p-azido acetophenone is used as the resist material. The resist material is coated on a substrate with a thickness of 1.2 microns by a conventional spin-coating method and is dried for 20 minutes at 80 degrees centigrade.

The substrate is then subjected to deep UV-ray exposure from a Xe-Hg lamp of 500 watts using, for example, an exposure apparatus model PLA-500F made by CANON. The entire surface of resist layer is exposed to the UV-rays without a mask, and the period of exposure is chosen to be 0.5 to 1 seconds corresponding to the value lower than Tth of FIG. 4. The exposure is controlled by an aluminum mirror. Thereafter, the resist layer is selectively exposed to an EB of 20 KeV, thereby forming the pattern. The total charge density of the EB is maintained at about $2 \times 10^{-5}$ coul/sq.cm. For convenience, the pattern obtained (after development) by this method is called pattern sample 1.

Pattern sample 1 obtained by the above method was compared to a pattern obtained using a resist solution of CMS only (pattern sample 2), the same material generally used in the prior art. The CMS solution was coated on the substrate. As a first comparison test, the substrate was subjected to an EB exposure only, the total charge density being maintained at $3 \times 10^{-5}$ coul/sq.cm using the same accelerating voltage as for pattern sample 1.

A third comparison sample (pattern sample 3), using the same resist solution of CMS used in preparing pattern sample 2, was prepared. The CMS coated substrate was exposed first to a deep UV-ray and thereafter to an EB exposure under the same conditions as those applied for pattern sample 1.

Figure 5:
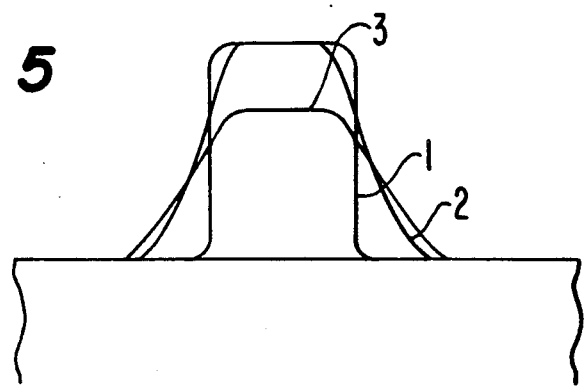
FIG. 5 shows a cross-section of resist patterns, providing a comparison between a pattern formed utilizing the method of the present invention (pattern 1) and patterns formed utilizing the resist material of the prior art (patterns 2 and 3).

Cross sections comparing the three pattern samples are shown schematically in FIG. 5. Pattern samples 2 and 3 have lower slopes extending outwardly, and the width of the resist layer at the substrate surface is wider (by about 0.3 microns) than at the top of the resist layer. This deformation caused reduction of contrast and blurring of formed patterns when exposed to a lithography process. Additionally, the thickness of pattern sample 3 (the distance from the substrate to the top of sample 3) is reduced to 0.7 microns, in contrast to the normal thickness of greater than 1.0 microns of pattern samples 1 and 2. This shows that pattern sample 3 is short of total energy of the UV-ray and EB exposures.

Comparing the three methods of forming resist patterns, the method applied for pattern sample 1, in which the resist material and exposure methods of the present invention are applied, obtains the most satisfactory shape for obtaining high resolution.

In a second embodiment, p-azido benzoic acid, used as the UV-ray absorbing material, is mixed with chloromethylated polystyrene (CMS). A solution of these materials is utilized as a spun-on resist coating, and the formed resist layer on the substrate is processed and exposed under the same conditions as performed for pattern sample 1 in embodiment 1. After comparison tests, the same results were obtained as for pattern sample 1 in embodiment 1. This shows that CMS resist material mixed with p-azido benzoic acid as the UV-ray absorbing material is effective in obtaining high resolution.

In a third embodiment, CMS resist material was mixed with 3-sulfonylazido benzoic acid utilized as the UV-ray absorbing material for pattern sample 1. The coated substrate was exposed under the same conditions as for pattern sample 1 in the first embodiment. The same comparison tests as in the first embodiment were performed using this resist material. D Test results show that 3-sulfonylazido benzoic acid is also effective as the UV-ray absorbing material mixed with the CMS resist.

In a fourth embodiment, polydiarylorthophtalate (abbreviated as PDOP) was used as the negative EB resist material. P-azido acetophenone, used as the UV-ray absorbing material, was mixed with PDOP. A solution of these materials was utilized as the coating material for forming the spun-on resist layer. The coated substrate was exposed under the same conditions as for pattern sample 1 in the first embodiment. The same tests as applied in the above embodiments were carried out, and, as a result, it was found that p-azido acetophenone mixed with PDOP is also an effective resist material for obtaining high resolution.

In a fifth embodiment, polymethyl methacrylate (abbreviated as PMMA) was used as the positive EB resist. P-azido acetophenone, as the UV-ray absorbing material, was mixed with the PMMA. The coated substrate was exposed under the same condition as for pattern sample 1 in the first embodiment and was then compared to pattern samples 2 and 3. This combination of materials proved to be effective for obtaining high resolution as well.

In a sixth embodiment, test were performed using the same resist material and the same exposure conditions utilized in obtaining pattern sample 1 in the first embodiment, except p that the substrate was tilted at an angle of 30 to 70 degrees relative to the incident UV-rays. Broadening of the pattern width was further reduced, resulting in further improvement in resolution. This tilting of the substrate during exposure was effective even for obtaining pattern samples 2 or 3, in which a resist material of the prior art (CMS), having no UV-ray absorbing material, is used.

Further tests were performed using an X-ray beam instead of EB on the same resist materials used in the above embodiments. The X-ray beam was irradiated onto the resist layer through an X-ray mask. As an X-ray source, an electron beam excited source (20 KeV accelerating voltage) for generating Al-K alpha ray was utilized. An SOR can be also utilized as an X-ray source. The energy irradiated onto the resist layer should be approximately 500 mJ/sq.cm and the beam on time should be adjusted accordingly. Conditions for the UV-ray exposure were the same as those applied in the first embodiment. Very similar results were obtained in improving the resolution.

When an UV-ray beam wavelength longer than 280 nm was filtered out during the UV-ray exposure process of the first embodiment, the increase of pattern width is further reduced, resulting in a further improvement of contrast and resolution.

The resist materials such as CMS, PDOP, or PMMA used in the above embodiments have a sensitivity to deep UV wavelengths of shorter than 300 nm. A material such as p-azido acetophenone, p-azido benzoic acide, or 3-sulfonylazido benzoic acide, each having a large absorption coefficient (at 200 to 300 nm), is utilized as a UV-ray absorbing material mixed with the above described resist materials.

When an EB or X-ray resist material having a sensitivity near 365 nm or 436 nm wavelength is used, for example, OMR-83 or OFPR made by TOKYO OUKA KOGYO, a UV-ray exposure having a peak energy distribution around the above wavelength is very effective and a good result can also be obtained. Further, any of the above-mentioned ultraviolet-ray absorbing materials can be combined with any of the above-mentioned resist materials to achieve the improved resolution of the present invention.

In the above embodiments, the EB or X-ray exposure is performed after the exposure of UV-ray onto the entire substrate surface. However, the order of exposure can be reversed so that the resist layer is first exposed selectively to the EB or X-ray and is subsequently exposed to the UV-ray over its entire surface. The same improvement of resolution is obtained.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A method of forming a resist pattern on a substrate, said method comprising the steps of:

preparing a solution of negative type electron-beam or X-ray sensitive resist material mixed with an ultraviolet-ray absorbing material selected from p-azido acetophenone, p-azido benzoic acid or 3-sulfonylazido benzoic acid;

coating the substrate with the solution, thereby forming a resist layer on the substrate;

selectively exposing a first portion of said resist layer to electron-beam or X-ray irradiation of a predetermined total irradiation density value such that the quantity of backward scattering electrons scattered from said first portion and into adjacent portions of the resist layer is insufficient to induce a reaction in said adjacent portions of the resist layer; and exposing said first portion and said adjacent portions of the resist layer to ultraviolet-rays at a predetermined irradiation level that is insufficient by itself to induce a reaction in said adjacent portions of the resist layer.

2. A method as recited in claim 1, wherein said resist layer is first exposed to electron-beam or X-ray irradiation and is subsequently exposed to ultraviolet-rays.

3. A method as recited in claim 1, wherein said resist layer is first exposed to ultraviolet-rays and is subsequently exposed to electron-beam or X-ray irradiation.

4. A method as recited in claim 1, wherein said ultraviolet-ray absorbing material includes p-azido acetophenone and said resist material includes chloromethylated polystyrene (CMS).

5. A method as recited in claim 1, wherein said ultraviolet-ray absorbing material includes p-azido benzoic acid and said resist material includes chloromethylated polystyrene (CMS).

6. A method as recited in claim 1, wherein said ultraviolet-ray absorbing material includes 3-sulfonylazido benzoic acid and said resist material includes chloromethylated polystyrene (CMS).

7. A method as recited in claim 1, wherein said ultraviolet-ray absorbing material includes p-azido acetophenone and said resist material includes polydiarylorthophtalate (PDOP).

8. A method as recited in claim 1, wherein said ultraviolet-ray absorbing material includes p-azido acetophenone and said resist material includes polymethyl methacrylate (PMMA).

9. A method as recited in claim 1, wherein said step of exposing said resist layer to ultraviolet-rays further includes the step of tilting said substrate at an angle in relation to the ultraviolet-ray.

10. A method as recited in claim 1, wherein said ultraviolet-ray absorbing material is selected from p-azido benzoic acid, and said resist material is selected from chloromethylated polystyrene (CMS), polydiarylorthophtalate (PDOP), or polymethylmethacrylate (PMMA).

11. A method as recited in claim 10, wherein the step of exposing said resist layer to ultraviolet-rays includes filtering ultraviolet light having a wavelength longer than 280 nm.

12. A method of forming a resist pattern on a substrate, comprising the steps of:
preparing a solution of a negative type electron sensitive resist material and an ultraviolet light sensitive material selected from p-azido acetophenone, p-azido benzoic acid or 3-sulfonylazido benzoic acid;
coating the substrate with the solution, thereby forming a resist layer on the substrate;
selectively exposing a first portion of said resist layer to electron beam irradiation of a predetermined total irradiation density level such that the quantity of backward scattering electrons scattered into adjacent portions of the layer is less than the electron beam resist production level in said adjacent portions of the layer; and
exposing said first portion and said adjacent portions of the resist layer to ultraviolet light at a predetermined ultraviolet light energy density level that is less than the ultraviolet resist production level of said adjacent portions of the resist layer.

13. A method as recited in claim 12, wherein said step of selectively
exposing said first portion and said adjacent portions of the resist layer to ultraviolet light is performed with said substrate tilted at an angle in relation to the ultraviolet light.

14. A method of forming a resist pattern on a substrate, comprising the steps of:
preparing a solution of a negative type X-ray sensitive resist material and an ultraviolet light sensitive material selected from p-azido acetophenone, p-azido benzoic acid or 3-sulfonylazido benzoic acid;
coating the substrate with the solution, thereby forming a resist layer on the substrate;
selectively exposing a first portion of said resist layer to X-ray beam irradiation of a predetermined total irradiation density level such that the quantity of backward scattering electrons scattering into adjacent portions of the layer is less than the X-ray beam resist production level in said adjacent portions of the layer; and
exposing said first portion and said adjacent portions of the resist layer to ultraviolet light at a predetermined ultraviolet light energy density level that is less than the ultraviolet light resist production level of said adjacent portions of the resist layer.

15. A method as recited in claim 14, wherein said step of selectively
exposing said first portion and said adjacent portions of the resist layer to ultraviolet light is performed with said substrate tilted at an angle in relation to the ultraviolet light.

16. A method of forming a resist pattern on a substrate, said method comprising the steps of:
preparing a solution of negative type electron-beam or X-ray sensitive resist material mixed with ultraviolet-ray absorbing material having a large absorption coefficient at wavelengths in the range of 200 to 300 nm;
coating the substrate with the solution, thereby forming a resist layer on the substrate;
selectively exposing a first portion of said resist layer to electron-beam or X-ray irradiation of a predetermined total irradiation density value such that the quantity of backward scattering electrons scattered from said first portion and into adjacent portions of the resist layer is insufficient to induce a reaction in said adjacent portions of the resist layer; and
exposing said first portion and said adjacent portions of the resist layer to ultraviolet radiation at a predetermined irradiation level that is insufficient by itself to induce a reaction in said adjacent portions of the resist layer and in which radiation the ultraviolet-rays having wavelengths greater than the wavelengths where said resist material has sensitivity to deep UV radiation are filtered out.

17. A method of forming a resist pattern on a substrate comprising the steps of:
preparing a solution of a negative type electron sensitive material and an ultraviolet light sensitive material having a large absorption coefficient at wavelengths in the range of 200 to 300 nm;
coating the substrate with the solution, thereby forming a resist layer on the substrate;
selectively exposing a first portion of said resist layer to electron beam irradiation of a predetermined total irradiation density level such that the quantity of backward scattering electrons scattered into adjacent portions of the layer is less than the electron beam resist production level in said adjacent portions of the layer; and
exposing said first portion and said adjacent portions of the resist layer to ultraviolet radiation at a predetermined ultraviolet light energy density level that is less than the ultraviolet resist production level of said adjacent portions of the resist layer and in which radiation the ultraviolet-rays having wavelengths greater than the wavelengths where said resist material has sensitivity to deep UV radiation are filtered out.

18. A method of forming a resist pattern on a substrate, comprising the steps of:
preparing a solution of a negative type X-ray sensitive material and an ultraviolet light sensitive material and an ultraviolet light sensitive material having a large absorption coefficient at wavelengths in the range of 200 to 300 nm;
coating the substrate with the solution, thereby forming a resist layer on the substrate;
selectively exposing a first portion of said resist layer to X-ray beam irradiation of a predetermined total irradiation density level such that the quantity of backward scattering electrons scattering into adjacent portions of the layer is less than the X-ray beam resist production level in said adjacent portions of the layer; and
exposing said first portion and said adjacent portions of the resist layer to ultraviolet radiation at a predetermined ultraviolet light energy density level that is less than the ultraviolet light resist production level of said adjacent portions of the resist layer and in which radiation the ultraviolet-rays having wavelengths greater than the wavelengths where said resist material has sensitivity to deep UV radiation are filtered out.

* * * * *